(12) United States Patent
Park

(10) Patent No.: US 10,018,858 B2
(45) Date of Patent: Jul. 10, 2018

(54) DISPLAY DEVICE AND SHORT CIRCUIT TEST METHOD

(71) Applicant: Samsung Display Co., Ltd., Yongin-si, Gyeonggi-Do (KR)

(72) Inventor: Kyong-Tae Park, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/400,447

(22) Filed: Jan. 6, 2017

(65) Prior Publication Data
US 2017/0269398 A1 Sep. 21, 2017

(51) Int. Cl.
| | |
|---|---|
| *G01R 31/28* | (2006.01) |
| *G01R 31/26* | (2014.01) |
| *H01L 21/66* | (2006.01) |
| *G02F 1/13* | (2006.01) |
| *H01L 27/12* | (2006.01) |
| *H01L 27/32* | (2006.01) |
| *H05B 33/08* | (2006.01) |

(52) U.S. Cl.
CPC ....... *G02F 1/1309* (2013.01); *G01R 31/2841* (2013.01); *H01L 22/30* (2013.01); *H01L 27/1244* (2013.01); *H01L 27/3276* (2013.01); *H05B 33/086* (2013.01); *H05B 33/0887* (2013.01); *H05B 33/0896* (2013.01)

(58) Field of Classification Search
CPC ......................................... H01L 22/30–22/34
See application file for complete search history.

(56) References Cited

U.S. PATENT DOCUMENTS

| | | | | | |
|---|---|---|---|---|---|
| 5,852,480 | A | * | 12/1998 | Yajima | G02F 1/136204 349/39 |
| 2003/0085855 | A1 | * | 5/2003 | Tomita | G09G 3/006 345/87 |
| 2005/0006602 | A1 | | 1/2005 | Perdu et al. | |
| 2008/0100331 | A1 | * | 5/2008 | Qi | G09G 3/3648 324/750.3 |
| 2015/0262526 | A1 | | 9/2015 | Park et al. | |
| 2016/0035279 | A1 | | 2/2016 | Park et al. | |

FOREIGN PATENT DOCUMENTS

| | | |
|---|---|---|
| KR | 10-2014-0033913 A | 3/2014 |
| KR | 10-2014-0039923 A | 4/2014 |

* cited by examiner

*Primary Examiner* — Robert Bachner
*Assistant Examiner* — Molly Reida
(74) *Attorney, Agent, or Firm* — Innovation Counsel LLP

(57) ABSTRACT

A display device includes a substrate, one line on the substrate, the one line extending from a peripheral region through a display region, pixels on the display region, the pixels being connected to the one line, an outer line on the peripheral region, the outer line being connected to the one line during a short circuit test process that detects a position of a short circuit defect, an electrostatic protection resistor on the peripheral region, the electrostatic protection resistor being connected to the outer line, a pad on the peripheral region, the pad being connected to the outer line through the electrostatic protection resistor, a short circuit test signal being applied to the pad during the short circuit test process, and a bypass line connecting a node between the pad and the electrostatic protection resistor to the outer line.

13 Claims, 10 Drawing Sheets

DISPLAY DEVICE AND SHORT CIRCUIT TEST METHOD

CROSS-REFERENCE TO RELATED APPLICATION(S)

This application claims priority under 35 USC § 119 to Korean Patent Application No. 10-2016-0033475, filed on Mar. 21, 2016 in the Korean Intellectual Property Office (KIPO), the contents of which are incorporated herein in its entirety by reference.

BACKGROUND

1. Technical Field

Example embodiments relate generally to a display device. More particularly, embodiments of the present inventive concept relate to a display device of which a position of a short circuit defect is detected and a short circuit test methods that detects the position of the short circuit defect.

2. Description of the Related Art

When a short circuit defect, in which conductive lines are undesirably connected, thus unintended low-resistance path through which current bypasses a circuit, occurs in a display device, such as an organic light emitting diode (OLED) display device, a liquid crystal display (LCD) device, etc., a position of the short circuit defect may be detected using a microscope, and the conductive lines may be repaired at the detected position. However, when conductive lines at different layers are vertically connected, the position of this short circuit defect cannot be detected by the microscope. This short circuit defect may be referred to as an invisible short circuit defect, and a technique is required which can detect the position of the invisible short circuit defect.

SUMMARY

Some example embodiments provide a display device of which a short circuit defect is readily detected.

Some example embodiments provide a short circuit test method that readily detects a short circuit defect.

According to example embodiments, there is provided a display device including a substrate including a display region where an image is displayed and a peripheral region adjacent to the display region, at least one line on the substrate, the at least one line extending from the peripheral region through the display region, a plurality of pixels on the display region, the pixels being connected to the at least one line, an outer line on the peripheral region, the outer line being connected to the at least one line during a short circuit test process that detects a position of a short circuit defect, an electrostatic protection resistor on the peripheral region, the electrostatic protection resistor being connected to the outer line, a pad on the peripheral region, the pad being connected to the outer line through the electrostatic protection resistor, a short circuit test signal being applied to the pad during the short circuit test process, and a bypass line connecting a node between the pad and the electrostatic protection resistor to the outer line during the short circuit test process such that the short circuit test signal bypasses the electrostatic protection resistor.

In example embodiments, during the short circuit test process, the short circuit test signal may be applied to the at least one line through the bypass line and the outer line, and thermal energy generated at the at least one line by the short circuit test signal may be measured by a thermal detector to detect the position of the short circuit defect.

In example embodiments, the at least one line may be opened at the position of the short circuit defect, and a connecting line for connecting the opened line may be formed using a laser chemical vapor deposition process.

In example embodiments, the outer line may be a ring repair line.

In example embodiments, the at least one line may be opened at the position of the short circuit defect into a first portion and a second portion. The first portion of the at least one line may be connected to a driving circuit, and may directly receive an electrical signal from the driving circuit. The second portion of the at least one line may be connected to the ring repair line, and may receive the electrical signal through the ring repair line from the driving circuit.

In example embodiments, the outer line may be a repair data line.

In example embodiments, the display device may further include at least one repair pixel on the peripheral region, the repair pixel being connected to the repair data line. A light emitting element of at least one of the pixels located at the position of the short circuit defect may be connected to the repair pixel instead of the at least one of the pixels.

In example embodiments, the bypass line may be opened after the short circuit test process.

In example embodiments, the display device may further include a sealing member on the peripheral region, the sealing member surrounding the display region. A position at which the bypass line is opened may be covered by the sealing member.

In example embodiments, the display device may further include a transistor between the electrostatic protection resistor and the outer line, the transistor configured to selectively connect the electrostatic protection resistor and the outer line in response to a test control signal.

In example embodiments, the bypass line may connect the pad to the outer line such that the short circuit test signal bypasses the electrostatic protection resistor and the transistor.

In example embodiments, the display device may further include a first diode including an anode terminal connected to a node between the electrostatic protection resistor and the pad and a cathode terminal connected to a high voltage, and a second diode including a cathode terminal connected to the node between the electrostatic protection resistor and the pad and an anode terminal connected to a low voltage.

In example embodiments, the at least one line may be a data line.

According to example embodiments, there is provided a short circuit test method for a display device. In the method, an outer line formed on a peripheral region of a substrate may be connected to at least one line having a short circuit defect, a pad connected to an electrostatic protection resistor may be connected to the outer line through a bypass line that bypasses the electrostatic protection resistor, and a short circuit test signal is applied to the pad such that the short circuit test signal is supplied to the at least one line through the bypass line and the outer line.

In example embodiments, a position of the short circuit defect may be detected by measuring thermal energy generated at the at least one line by the short circuit test signal.

In example embodiments, the at least one line may be opened at the position of the short circuit defect, and a connecting line for connecting the opened line may be formed using a laser chemical vapor deposition process.

In example embodiments, the at least one line may be opened at the position of the short circuit defect into a first portion connected to a driving circuit and a second portion not connected to the driving circuit, and the second portion of the at least one line may be connected to the outer line.

In example embodiments, the outer line may be a ring repair line receiving an electrical signal that is the same as an electrical signal applied to the first portion of the at least one line.

In example embodiments, a light emitting element of at least one of the pixels located at the position of the short circuit defect may be connected to a repair pixel instead of the at least one of the pixels.

In example embodiments, the outer line may be a repair data line connected to the repair pixel.

Therefore, in a display device and a short circuit test method according to example embodiments, a short circuit test signal applied through a pad may be supplied to a line having a short circuit defect through a bypass line and an outer line by bypassing an electrostatic protection resistor, and thus a position of the short circuit defect may be readily detected by measuring thermal energy.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Hereinafter, embodiments of the present inventive concept will be explained in detail with reference to the accompanying drawings.

Figure 1:
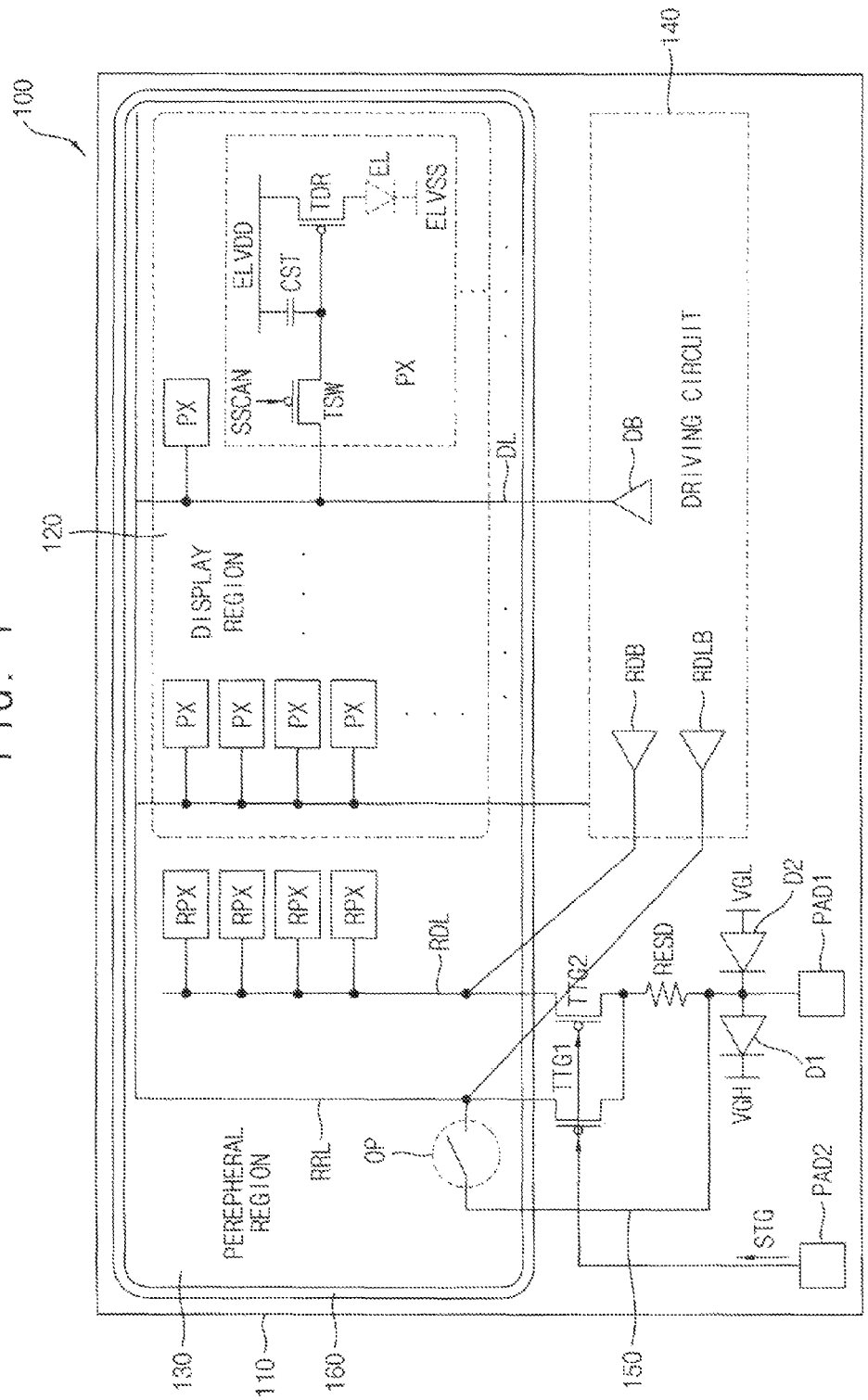
FIG. 1 is a diagram illustrating a display device according to example embodiments.

FIG. 1 is a diagram illustrating a display device according to example embodiments.

Referring to FIG. 1, a display device 100 includes a substrate 110 including a display region 120 and a peripheral region 130, at least one line DL extending from the peripheral region 130 through the display region 120 on the substrate 110, a plurality of pixels PX connected to the at least one line DL, an outer line RRL on the peripheral region 130, an electrostatic protection resistor RESD connected to the outer line RRL, a pad PAD1 connected to the outer line RRL through the electrostatic protection resistor RESD, and a bypass line 150 for connecting the pad PAD1 to the outer line RRL by bypassing the electrostatic protection resistor RESD.

The substrate 110 includes the display region 120 where an image is displayed and the peripheral region 130 adjacent to or surrounding the display region 120. The pixels PX may be formed on the display region 120, and the pixels PX may be arranged in a matrix form having a plurality of rows and a plurality of columns. In some example embodiments, the display device 100 may be an organic light emitting diode (OLED) display device, and each pixel PX may include the OLED EL. For example, each pixel PX may include a switching transistor TSW that transfers a data voltage applied to the line DL to a storage capacitor CST in response to a scan signal SSCAN, the storage capacitor CST that stores the data voltage, a driving transistor TDR that generates a driving current from a high power supply voltage ELVDD to a low power supply voltage ELVSS based on the data voltage stored in the storage capacitor CST, and the OLED EL that emits light based on the driving current from the high power supply voltage ELVDD to the low power supply voltage ELVSS. Although FIG. 1 illustrates an example of the pixel PX including two transistors TSW and TDR and one capacitor CST, the pixel PX may have various structures according to example embodiments. In some example embodiments, a short circuit test process that detects a position of a short circuit defect may be performed before the OLED EL is formed in the pixel PX.

The short circuit test process may be performed to detect an accurate position of a short circuit defect that occurs at any data line DL extending from the peripheral region 130 through the display region 120. In some example embodiments, as illustrated in FIG. 1, the line of which the position of the short circuit defect is detected may be a data line, but the present inventive concept may not be limited thereto. For example, in other example embodiments, the line of which the position of the short circuit defect is detected may be any line, such as a sensing line, a scan line, an emission control line, an initialization control line, etc. Hereinafter, examples where the line of which the position of the short circuit defect is detected is the data line DL will be described. Each data line DL may be connected to a data output buffer DB, and may extend through the display region 120. In the display region 120, each data line DL may be connected to the pixels PX. In some example embodiments, the short circuit test process may be performed before a driving circuit 140 is mounted on the peripheral region 130 of the substrate 110.

The outer line RRL may be formed around at least a portion of the display region 120 on the peripheral region 130 of the substrate 110. For example, the outer line RRL may extend in a data line direction from a pad portion of the peripheral region 130, and then extend in a scan line direction. Thus, the outer line RRL may be formed adjacent to two sides of the display region 120. In other examples, the outer line RRL may be formed adjacent to three sides, or a left side, an upper side and a right side of the display region 120. However, the outer line RRL may have any shape that is connected to at least one pad PAD1 and is able to be connected to the line DL in which the short circuit defect is detected. Although FIG. 1 illustrates an example where the outer line RRL is connected to one pad PAD1 at one end, in some example embodiments, the outer line RRL may be connected to the pad PAD1 at one end and may be further connected to another pad at the other end. Further, although FIG. 1 illustrates an example where the data lines DL may be able to be connected to one outer line RRL, in some example embodiments, the data lines DL at a left portion of the display region 120 may be able to be connected to the outer line RRL, and the data lines DL at a right portion of the display region 120 may be able to be connected to another outer line (not shown). In other example embodiments, the display device 100 may include two or more outer lines RRL each being able to be connected to all respective data lines DL.

The outer line RRL may be connected to the data line DL of which the position of the short circuit defect is detected during the short circuit test process according to example embodiments. In some example embodiments, the short circuit test process may be performed to detect a position of an invisible short circuit defect that cannot be detected by a microscope, and the outer line RRL may be connected to the line DL having the invisible short circuit defect. For example, by an array test or a sheet test, an occurrence of the short circuit defect at the data line DL may be detected. In a case where the data line DL is undesirably connected to another line located above or below the data line DL, whether or not the data line DL has the short circuit defect may be checked by the array test or the sheet test, but a position of the short circuit defect cannot be detected by a microscope, etc. The outer line RRL may be connected to the data line DL having this invisible short circuit defect during the short circuit test process.

The outer line RRL may be connected to the electrostatic protection resistor RESD formed on the peripheral region 130, and may be connected to the pad PAD1 formed on the peripheral region 130 through the electrostatic protection resistor RESD. In some example embodiments, the electrostatic protection resistor RESD may be a polysilicon resistor, and may prevent or reduce an electrostatic charge from entering into an internal circuit through the pad PAD1. In some example embodiments, the display device 100 may further include electrostatic discharge diodes D1 and D2 formed at a node between the electrostatic protection resistor RESD and the pad PAD1. For example, the display device 100 may include a first diode D1 including an anode terminal connected to the node between the electrostatic protection resistor RESD and the pad PAD1 and a cathode terminal connected to a high voltage (e.g., a high gate voltage VGH), and a second diode D2 including a cathode terminal connected to the node between the electrostatic protection resistor RESD and the pad PAD1 and an anode terminal connected to a low voltage (e.g., a low gate voltage VGL). These electrostatic discharge diodes D1 and D2 may provide a path through which the electrostatic charge is discharged.

In some example embodiments, the display device 100 may further include a transistor TTG1 between the electrostatic protection resistor RESD and the outer line RRL. The transistor TTG1 may selectively connect the electrostatic protection resistor RESD and the outer line RRL in response to a test control signal STG applied through a pad PAD2. For example, the transistor TTG1 may connect the electrostatic protection resistor RESD to the outer line RRL during a ring repair test or a repair pixel test, and may disconnect the electrostatic protection resistor RESD from the outer line RRL after the ring repair test or the repair pixel test.

During the short circuit test process, a short circuit test signal may be applied to the pad PAD1. The bypass line 150 may connect the pad PAD1 to the outer line RRL during the short circuit test process such that the short circuit test signal bypasses the electrostatic protection resistor RESD. Further, in some example embodiments where the transistor TTG1 is disposed between the electrostatic protection resistor RESD and the outer line RRL, the bypass line 150 may connect the pad PAD1 to the outer line RRL such that the short circuit test signal bypasses the electrostatic protection resistor RESD and the transistor TTG1. Accordingly, during the short circuit test process, the short circuit test signal applied to the pad PAD1 may be supplied to the line data DL having the short circuit defect through the bypass line 150 and the outer line RRL. If the short circuit test signal is applied to the data line DL having the short circuit defect, thermal energy may be emitted at the line DL, and, in particular, high thermal energy may be emitted at the position of the short circuit defect of the data line DL. In some example embodiments, the short circuit test signal may be a high current signal such that the high thermal energy is emitted at the position of the short circuit defect. The thermal energy generated at the data line DL having the short circuit defect by the short circuit test signal may be measured by a thermal detector, a position at which the high thermal energy is emitted may be detected as the position of the short circuit defect.

In a case where the short circuit test signal is applied by the driving circuit 140, a sufficient current may not be supplied to the line DL having the short circuit defect due to the current output limitation of the data output buffer DB of the driving circuit 140, and thus sufficient thermal energy may not be emitted at the position of the short circuit defect. In this case, the thermal detector may not detect the position of the short circuit defect, or may require a long time to detect the position of the short circuit defect. Further, in a case where the short circuit test signal is applied through the electrostatic protection resistor RESD and/or the transistor TTG1 to the data line DL having the short circuit defect even if the short circuit test signal is applied through the pad PAD1, a sufficient current may not be supplied to the line DL having the short circuit defect due to current reduction by the electrostatic protection resistor RESD and/or the on-current limitation of the transistor TTG1, and thus sufficient thermal energy may not be emitted at the position of the short circuit defect. However, in the display device 100 according to example embodiments, the short circuit test signal applied through the pad PAD1 may be supplied to the data line DL having the short circuit defect through the bypass line 150 and the outer line 160, and thus a sufficient current may be supplied to the data line DL having the short circuit defect. Accordingly, sufficient thermal energy may be emitted at the position of the short circuit defect, and the position of the short circuit defect may be readily detected by the thermal energy measurement.

In some example embodiments, if the position of the short circuit defect is detected, the line DL having the short circuit defect may be opened (or cut) at the detected position of the short circuit defect (or at two positions having the detected position therebetween), and thus a portion where the short circuit defect occurs may be separated from the line DL. Further, a connecting line for connecting the opened line DL may be formed using a laser chemical vapor deposition process that is suitable for a local deposition, and thus the line DL having the short circuit defect may be repaired.

Further, after the short circuit test process, the bypass line 150 may be opened (or cut) at a predetermined position OP. For example, the bypass line 150 may be opened by a laser processing. In some example embodiments, the display device 100 may further include a sealing member 160 surrounding the display region 120 on the peripheral region 130, and the position OP at which the bypass line 150 is opened may be covered by the sealing member 160. For example, the sealing member 160 may include a glass frit for preventing moisture or air from penetrating the sealing member 160. Thus, even if a crack occurs at an insulating layer or an inorganic layer when the layer processing is performed to open the bypass line 150, corrosion by the moisture may be prevented because the crack is covered by the sealing member 160.

In some example embodiments, as illustrated in FIG. 1, the outer line RRL connected to the line DL having the short circuit defect during the short circuit test process may be a ring repair line. In this case, the display device 100 may not include dedicated lines for the short circuit test process, and thus a size and a cost of the display device 100 may be reduced.

The data line DL having the short circuit defect may be repaired using the outer line RRL which is the ring repair line. In a case where the connecting line for repairing the data line DL cannot be formed by the laser chemical vapor deposition process, the data line DL having the short circuit defect may be repaired using the outer line RRL which is the ring repair line. For example, the data line DL having the short circuit defect may be opened at the position of the short circuit defect, and may be divided into a first portion and a second portion. The first portion of the data line DL may be connected to the driving circuit 140, and directly receives an electrical signal (e.g., a data voltage) from the data output buffer DB of the driving circuit 140. The second portion of the data line DL may be connected to the outer line RRL which is the ring repair line, and may receive the electrical signal through the outer line RRL which is the ring repair line from a repair data line output buffer RDLB of the driving circuit 140. Thus, the pixels PX located lower than the position of the short circuit defect may receive the data voltage through the first portion of the data line DL, and the pixels PX located upper than the position of the short circuit defect may receive the data voltage through the outer line RRL which is the ring repair line and the second portion of the data line DL.

In some example embodiments, the display device 100 may further include a repair data line RDL formed on the peripheral region 130, a transistor TTG2 that selectively connects the electrostatic protection resistor RESD and the repair data line RDL in response to the test control signal STG, and a plurality of repair pixels RPX connected to the repair data line RDL. In some example embodiments, a light emitting element (e.g., the OLED) EL of at least one of the pixels PX located at the position of the short circuit defect may be connected to the repair pixel RPX instead of the at least one of the pixels PX. That is, the light emitting element may be disconnected from the driving transistor TDR of the at least one of the pixels PX, and may be connected to the repair pixel RPX. In this case, the repair pixel RPX may generate a driving current based on a data voltage output from a repair pixel data output buffer RDB of the driving circuit 140, and the light emitting element EL may emit light based on the driving current generated by the repair pixel RPX.

As described above, in the display device 100 according to example embodiments, during the short circuit test process that detects the position of the short circuit defect, the short circuit test signal applied through the pad PAD1 may be supplied to the data line DL having the short circuit defect through the bypass line 150 and the outer line RRL which is the ring repair line by bypassing the electrostatic protection resistor RESD and/or the transistor TTG1. Accordingly, the short circuit test signal having a sufficient current may be supplied to the data line DL having the short circuit defect, and thus the position of the short circuit defect may be readily detected by the thermal energy measurement. Further, in the display device 100 according to example embodiments, the outer line RRL which is the ring repair line may be used as a line for applying the short circuit test signal, and a dedicate line for the position detection of the short circuit defect may not be required, thereby reducing the size and the cost of the display device 100. Further, since the bypass line 150 may be opened at the position OP covered by the sealing member 160 after the short circuit test process, the bypass line 150 may not affect the outer line RRL which is the ring repair line after the short circuit test process, and the corrosion by the moisture may be prevented even if the crack occurs by the laser processing for opening the bypass line 150.

Figure 2:
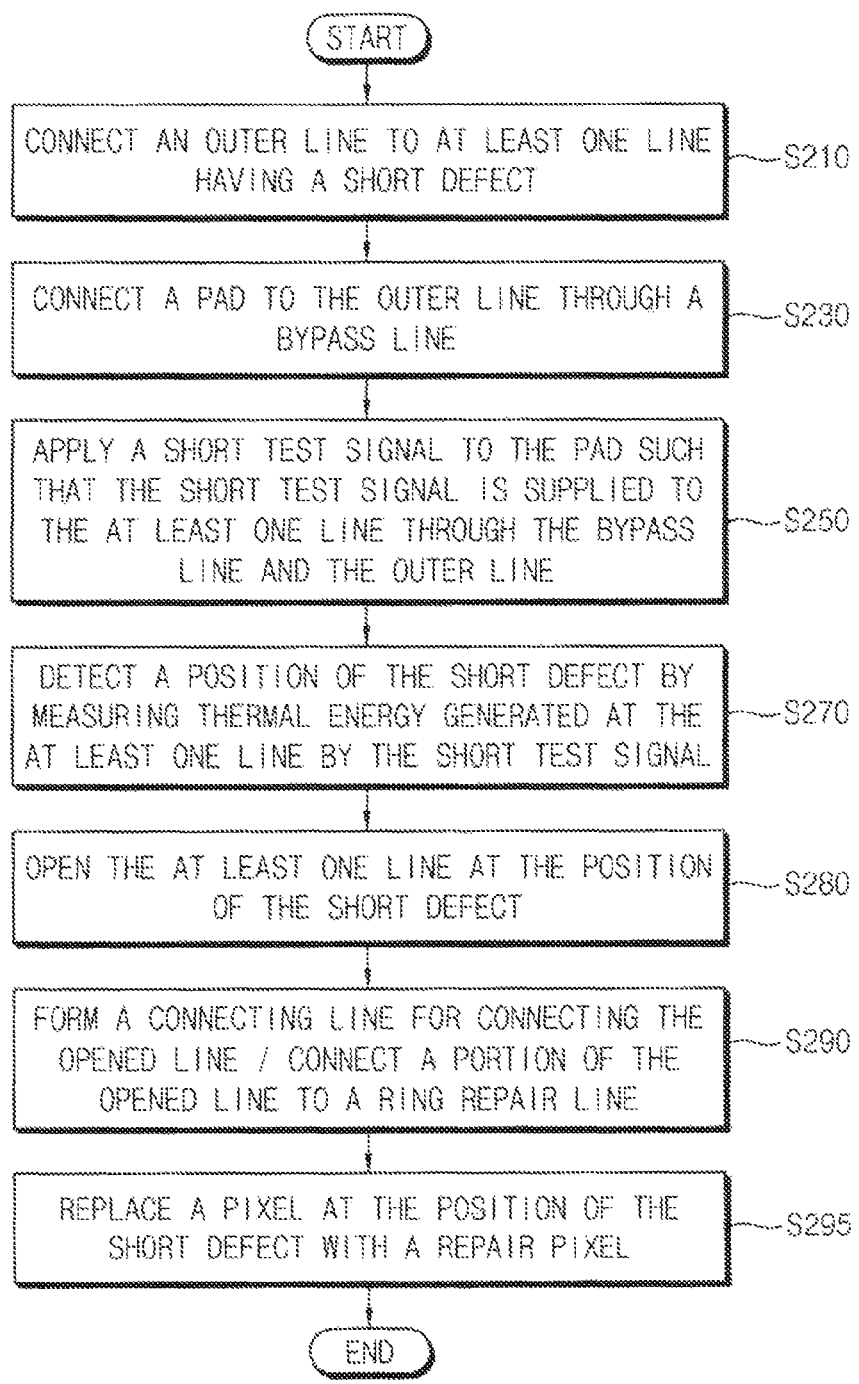
FIG. 2 is a flowchart illustrating a short circuit test method for a display device according to example embodiments.

FIG. 2 is a flowchart illustrating a short circuit test method for a display device according to example embodiments, and FIG. 3 through FIG. 5B are diagrams for describing a short circuit test method for a display device according to example embodiments.

Figure 3:
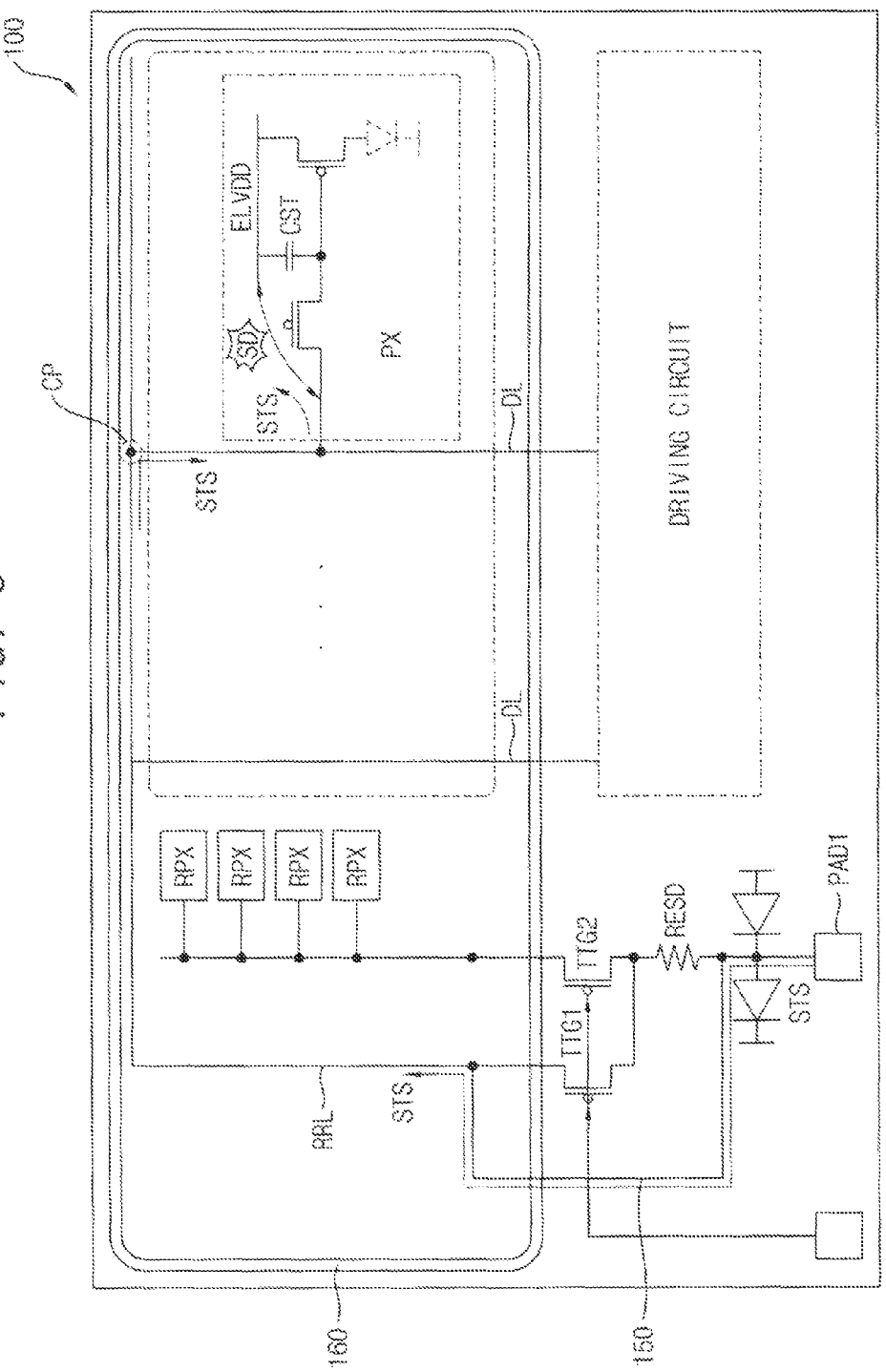
FIGS. 3, 4, 5A and 5B are diagrams for describing a short circuit test method for a display device according to example embodiments.

Referring to FIGS. 2 and 3, an outer line RRL (e.g., a ring repair line) formed on a peripheral region of a substrate may be connected to a line DL (e.g., a data line DL) having a short circuit defect SD (S210). For example, during an array test or a sheet test, at least one of the data lines DL having the short circuit defect SD may be detected, and the outer line RRL which is the ring repair line and the data line DL may be connected at a connection point CP by a laser processing.

A pad PAD1 connected to an electrostatic protection resistor RESD may be connected to the outer line RRL through a bypass line 150 that bypasses the electrostatic protection resistor RESD (S230). In some example embodiments, the bypass line 150 may be previously connected to the outer line RRL before a short circuit test process. In other example embodiments, the bypass line 150 may be connected to the outer line RRL by a laser processing.

A short circuit test signal STS may be applied to the pad PAD1 such that the short circuit test signal STS is applied to the line DL having the short circuit defect SD through the bypass line 150 and the outer line RRL (S250). Accordingly, thermal energy may be emitted at the line DL having the short circuit defect SD by the short circuit test signal STS, and, in particular, high thermal energy may be emitted at a position of the short circuit defect SD.

Figure 4:
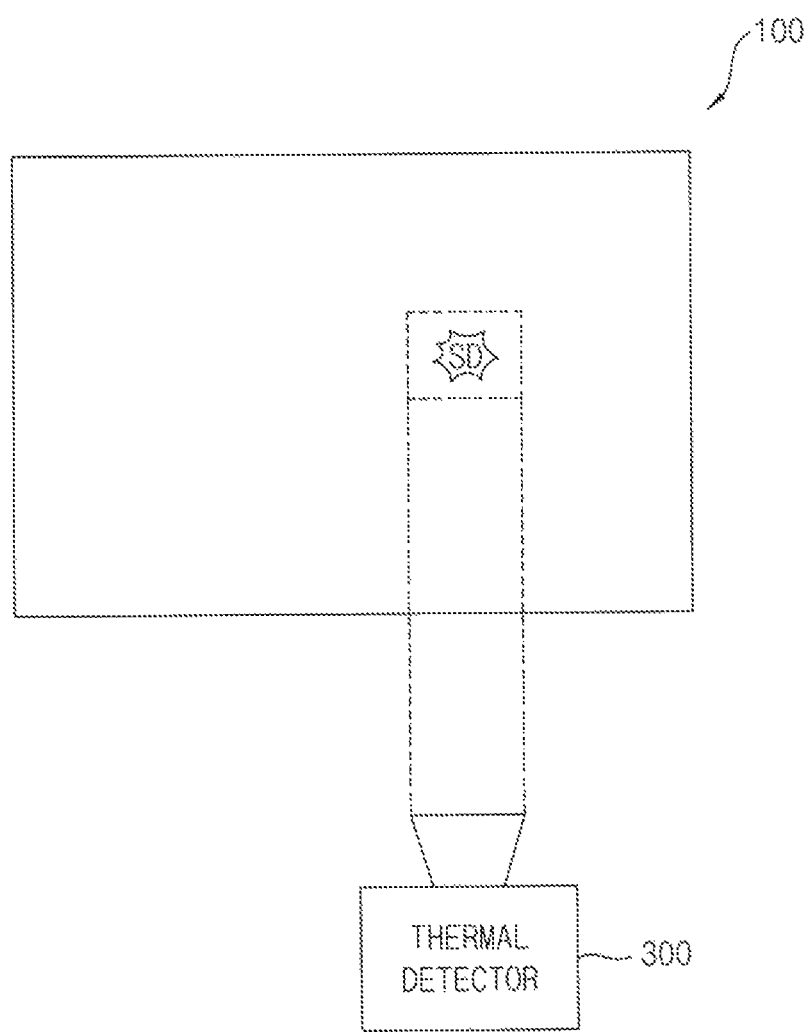

Referring to FIGS. 2 and 4, the position of the short circuit defect SD may be detected by measuring the thermal energy emitted at the line DL having the short circuit defect SD by the short circuit test signal STS using a thermal detector 300 (S270). For example, the thermal detector 300 may measure the thermal energy by using a light reception element, such as a photodiode, that receives a photon or the thermal energy and converts the received thermal energy into a current. Since the short circuit test signal STS is applied to the line DL having the short circuit defect SD by bypassing the electrostatic protection resistor RESD and/or a transistor TTG1 through the bypass line 150, the short circuit test signal STS having a sufficient current may be applied to the line DL having the short circuit defect SD, and thus the position of the short circuit defect SD may be rapidly and accurately detected.

Figure 5A:
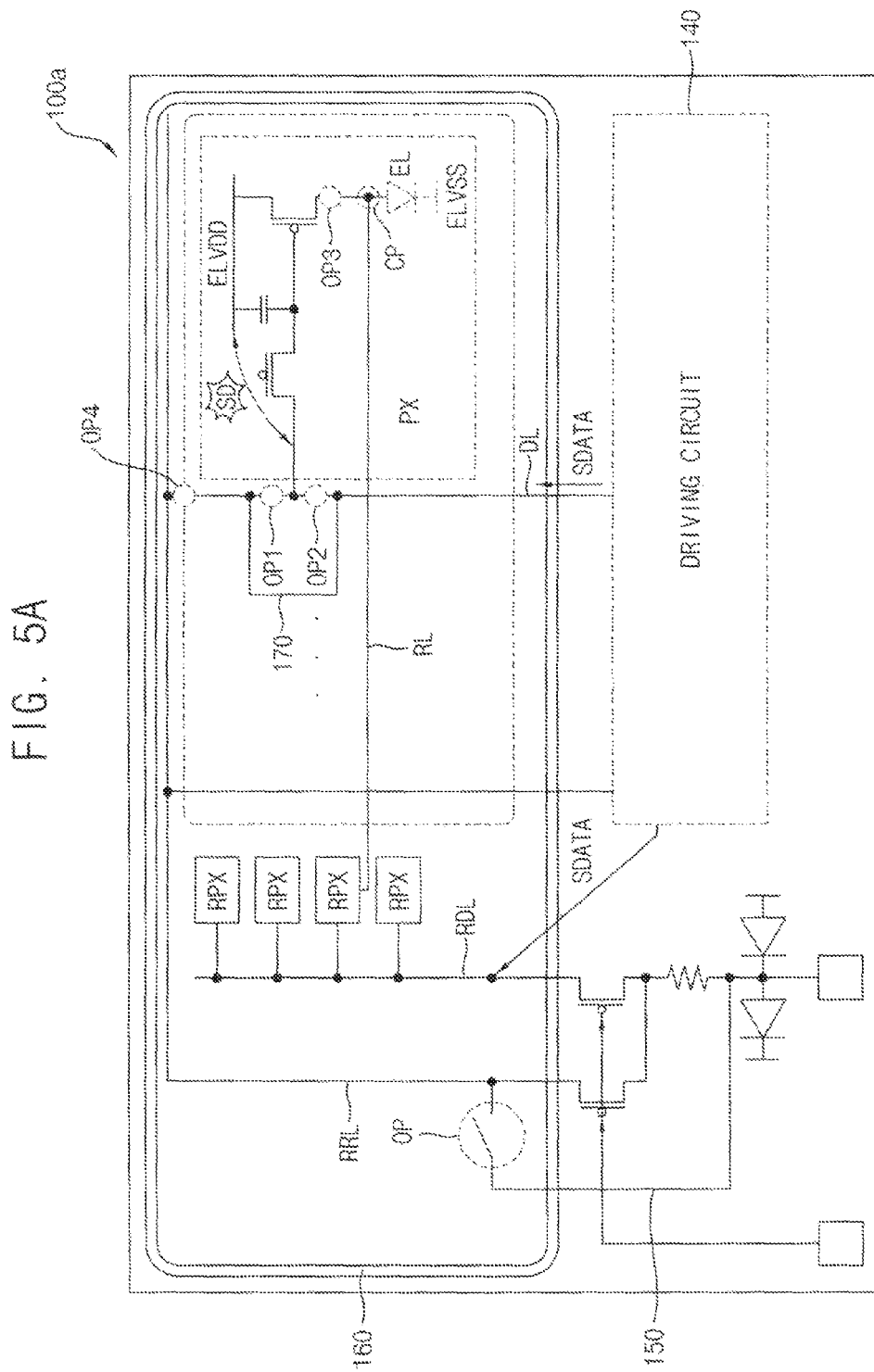

Once the position of the short circuit defect SD is detected, the line DL having the short circuit defect SD may be repaired, and a pixel PX located at the position of the short circuit defect SD may be repaired (S280, S290 and S295). In some example embodiments, as illustrated in FIG. 5A, the data line DL having the short circuit defect SD may be opened at the position of the short circuit defect SD (S280). For example, the data line DL having the short circuit defect SD may be opened at two positions OP1 and OP2 having the position of the short circuit defect SD therebetween by a laser processing. Further, the outer line RRL which is the ring repair line and the data line DL may be disconnected from each other at a predetermined position OP4, and a connecting line 170 for connecting the opened data line DL may be formed at the detected position of the short circuit defect SD (S290). Accordingly, a portion where the short circuit defect SD occurs may be separated from the data line DL, and thus the data line DL may be repaired. The bypass line 150 may be opened at a predetermined position OP which is covered by the sealing member 160, and thus may not affect the ring repair line after the short circuit test process. Further, the pixel PX located at the detected position of the short circuit defect SD may be repaired by connecting a light emitting element (e.g., an OLED) EL of the pixel PX to a repair pixel RPX instead of the pixel PX (S295). For example, the light emitting element EL and the pixels may be disconnected from each other by opening a predetermined position OP3, and the light emitting element EL and a repair line RL may be connected to each other at a predetermined connection point CP. A driving circuit 140 may apply a data voltage SDATA for the pixel PX having the short circuit defect SD to the repair pixel RPX through a repair data line RDL. Accordingly, the light emitting element EL may be driven by the repair pixel RPX instead of the pixel PX having the short circuit defect SD, and thus the pixel PX having the short circuit defect SD may be repaired.

Figure 5B:
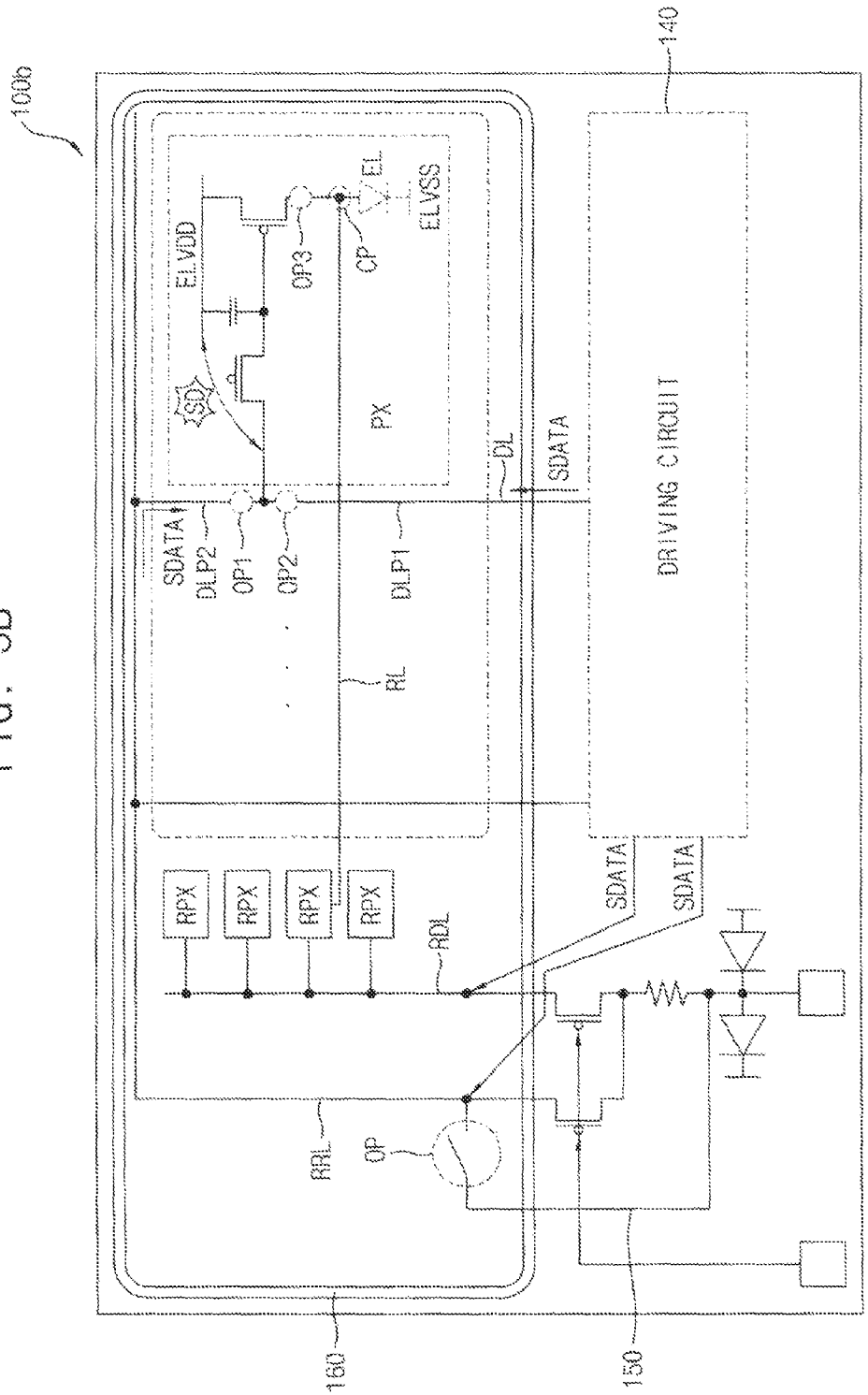

In other example embodiments, as illustrated in FIG. 5B, the data line DL having the short circuit defect SD may be opened at the detected position of the short circuit defect SD, and thus may be divided into a first portion DLP1 connected to the driving circuit 140 and a second portion DLP2 not connected to the driving circuit 140 (S280). For example, the data line DL having the short circuit defect SD may be opened at two positions OP1 and OP2 having the detected position of the short circuit defect SD therebetween by a laser processing. Thus, the pixels PX connected to the first portion DLP1 of the data line DL may receive the data voltage SDATA from the driving circuit 140 through the first portion DLP1 of the data line DL, and the pixels PX connected to the second portion DLP2 of the data line DL may receive the data voltage SDATA from the driving circuit 140 through the ring repair line and the second portion DLP2 of the data line DL (S290). Accordingly, a portion where the short circuit defect SD occurs may be separated from the data line DL, and thus the data line DL may be repaired. The bypass line 150 may be opened at a predetermined position OP inside the sealing member 160, and thus may not affect the ring repair line after the short circuit test process. Further, the pixel PX located at the detected position of the short circuit defect SD may be repaired by connecting the light emitting element EL of the pixel PX to the repair pixel RPX instead of the pixel PX (S295). Accordingly, the light emitting element EL may be driven by the repair pixel RPX instead of the pixel PX having the short circuit defect SD, and thus the pixel PX having the short circuit defect SD may be repaired.

As described above, in the short circuit test method for the display device 100 according to example embodiments, the short circuit test signal STS may be supplied to the data line DL having the short circuit defect SD through the bypass line 150 and the outer line RRL which is the ring repair line by bypassing the electrostatic protection resistor RESD and/or the transistor TTG1. Accordingly, the short circuit test signal STS having a sufficient current may be supplied to the data line DL having the short circuit defect SD, and thus the position of the short circuit defect SD may be readily detected by the thermal energy measurement.

Figure 6:
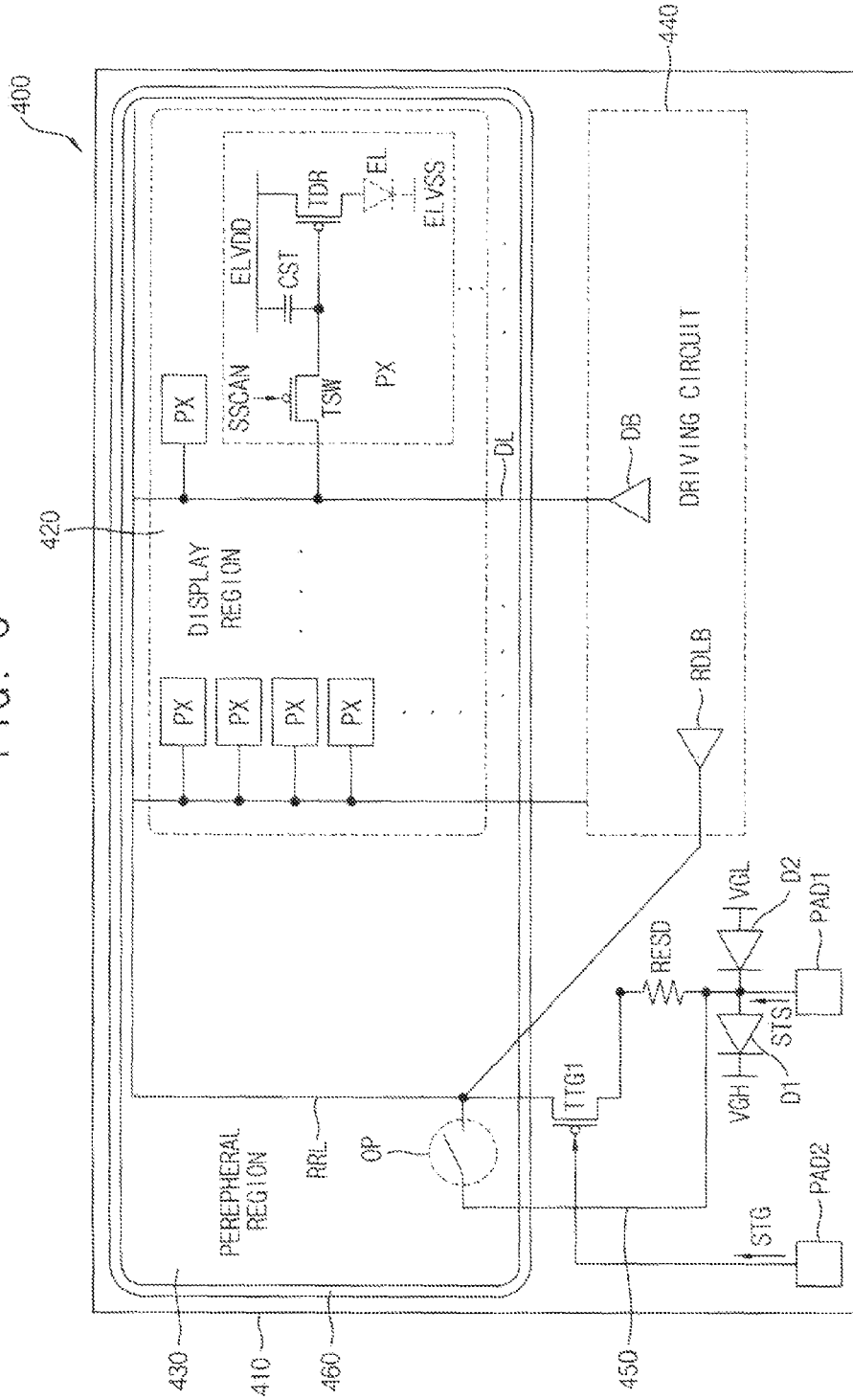
FIG. 6 is a diagram illustrating a display device according to example embodiments.

FIG. 6 is a diagram illustrating a display device according to example embodiments.

Referring to FIG. 6, a display device 400 includes a substrate 410 including a display region 420 and a peripheral region 430, at least one data line DL extending from the peripheral region 430 through the display region 420 on the substrate 410, a plurality of pixels PX connected to the at least one data line DL, an outer line RRL on the peripheral region 430, an electrostatic protection resistor RESD connected to the outer line RRL, a pad PAD1 connected to the outer line RRL through the electrostatic protection resistor RESD, and a bypass line 450 for connecting the pad PAD1 to the outer line RRL by bypassing the electrostatic protection resistor RESD. In some example embodiments, the display device 400 may further include a driving circuit 440, a sealing member 460, a pad PAD2 to which a test control signal STG is applied, a transistor TTG1 connected between the electrostatic protection resistor RESD and the outer line RRL, and electrostatic discharge diodes D1 and D2 formed at a node between the electrostatic protection resistor RESD and the pad PAD1. The display device 400 of FIG. 6 may have a similar configuration to a display device 100 of FIG. 1, except that the display device 400 does not include repair pixels RPX, a repair data line RDL and a transistor TTG2 connected to the repair data line RDL.

In the display device 400 according to example embodiments, during a short circuit test process that detects a position of a short circuit defect, a short circuit test signal STS applied through the pad PAD1 may be supplied to a data line DL having the short circuit defect through the bypass line 450 and the outer line RRL which is the ring repair line by bypassing the electrostatic protection resistor RESD and/or the transistor TTG1. Accordingly, the short circuit test signal STS having a sufficient current may be supplied to the data line DL having the short circuit defect, and thus the position of the short circuit defect may be readily detected by the thermal energy measurement. Further, in the display device 400 according to example embodiments, the outer line RRL which is the ring repair line may be used as a line for applying the short circuit test signal STS, and a dedicate line for the position detection of the short circuit defect may not be required, thereby reducing the size and the cost of the display device 400. Further, since the bypass line 450 may be opened at a position OP covered by the sealing member 460 after the short circuit test process, the bypass line 450 may not affect the outer line RRL which is the ring repair line after the short circuit test process, and corrosion by moisture may be prevented even if a crack occurs by a laser processing for opening the bypass line 450.

Figure 7:
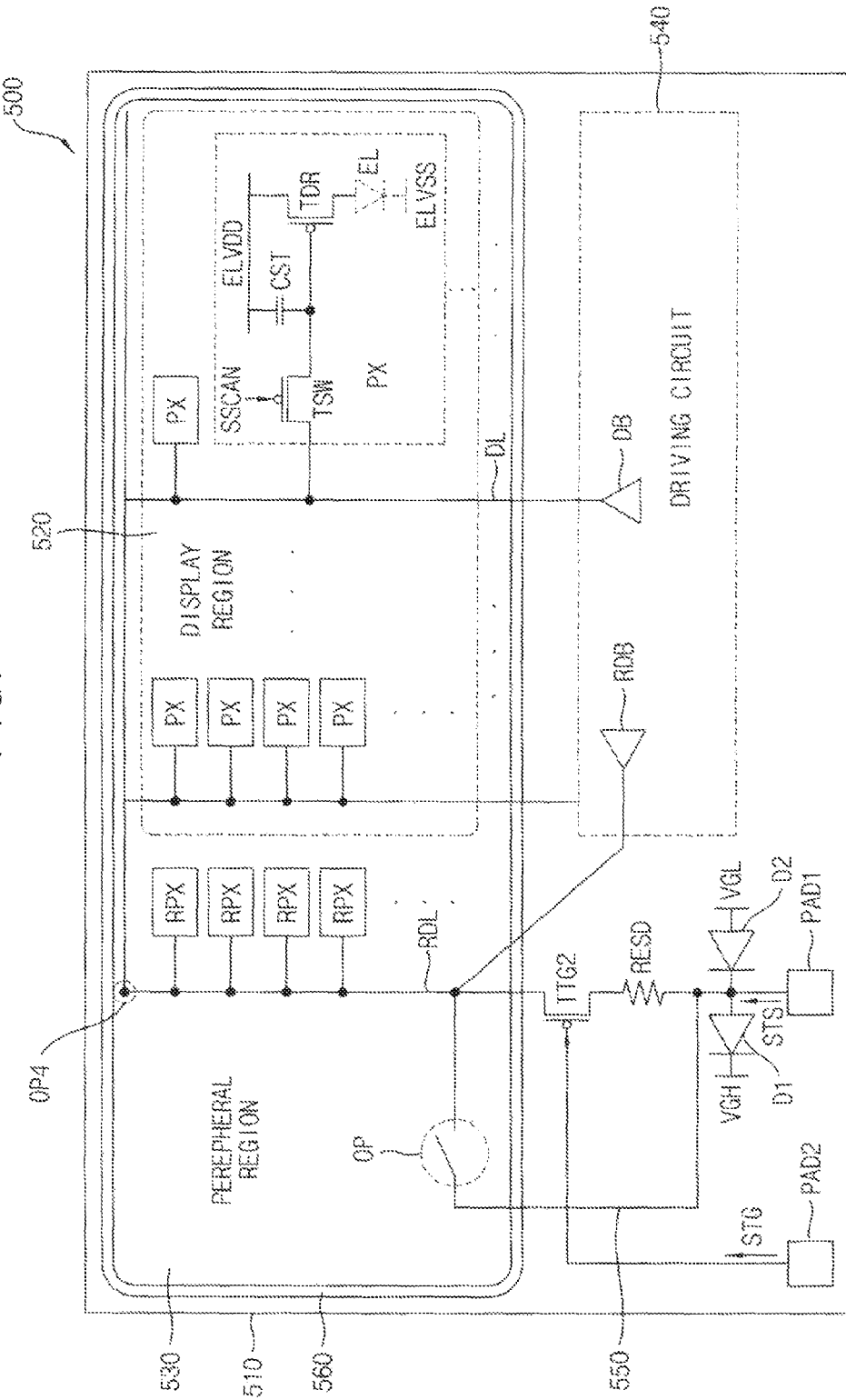
FIG. 7 is a diagram illustrating a display device according to example embodiments.

FIG. 7 is a diagram illustrating a display device according to example embodiments.

Referring to FIG. 7, a display device 500 includes a substrate 510 including a display region 520 and a peripheral region 530, at least one data line DL extending from the peripheral region 530 through the display region 520 on the substrate 510, a plurality of pixels PX connected to the at least one data line DL, an outer line RDL on the peripheral region 530, an electrostatic protection resistor RESD connected to the outer line RDL, a pad PAD1 connected to the outer line RDL through the electrostatic protection resistor RESD, and a bypass line 550 for connecting the pad PAD1 to the outer line RDL by bypassing the electrostatic protection resistor RESD. In some example embodiments, the display device 500 may further include a driving circuit 540, a sealing member 560, a pad PAD2 to which a test control signal STG is applied, a transistor TTG2 connected between the electrostatic protection resistor RESD and the outer line RDL, and electrostatic discharge diodes D1 and D2 formed at a node between the electrostatic protection resistor RESD and the pad PAD1. The display device 500 of FIG. 7 may have a similar configuration to a display device 100 of FIG. 1, except that the display device 500 does not include a ring repair line and a transistor TTG1 connected to the ring repair line. In the display device 500 of FIG. 7, the repair data line RDL (and a line extending in a scan line direction from the repair data line RDL) may be used as the outer line RDL for applying a short circuit test signal STS. In some example embodiments, after a short circuit test process, the repair data line RDL may be opened at a predetermined position OP4, and thus a load of the repair data line RDL may be reduced.

In the display device 500 according to example embodiments, during the short circuit test process that detects a position of a short circuit defect, the short circuit test signal STS applied through the pad PAD1 may be supplied to a data line DL having the short circuit defect through the bypass line 550 and the ring data line RDL by bypassing the electrostatic protection resistor RESD and/or the transistor TTG2. Accordingly, the short circuit test signal STS having a sufficient current may be supplied to the data line DL having the short circuit defect, and thus the position of the short circuit defect may be readily detected by the thermal energy measurement. Further, in the display device 500 according to example embodiments, the ring data line RDL may be used as a line for applying the short circuit test signal STS, and a dedicate line for the position detection of the short circuit defect may not be required, thereby reducing the size and the cost of the display device 500. Further, since the bypass line 550 may be opened at a position OP covered by the sealing member 560 after the short circuit test process, the bypass line 550 may not affect the ring data line RDL after the short circuit test process, and corrosion by moisture may be prevented even if a crack occurs by a laser processing for opening the bypass line 550.

Figure 8:
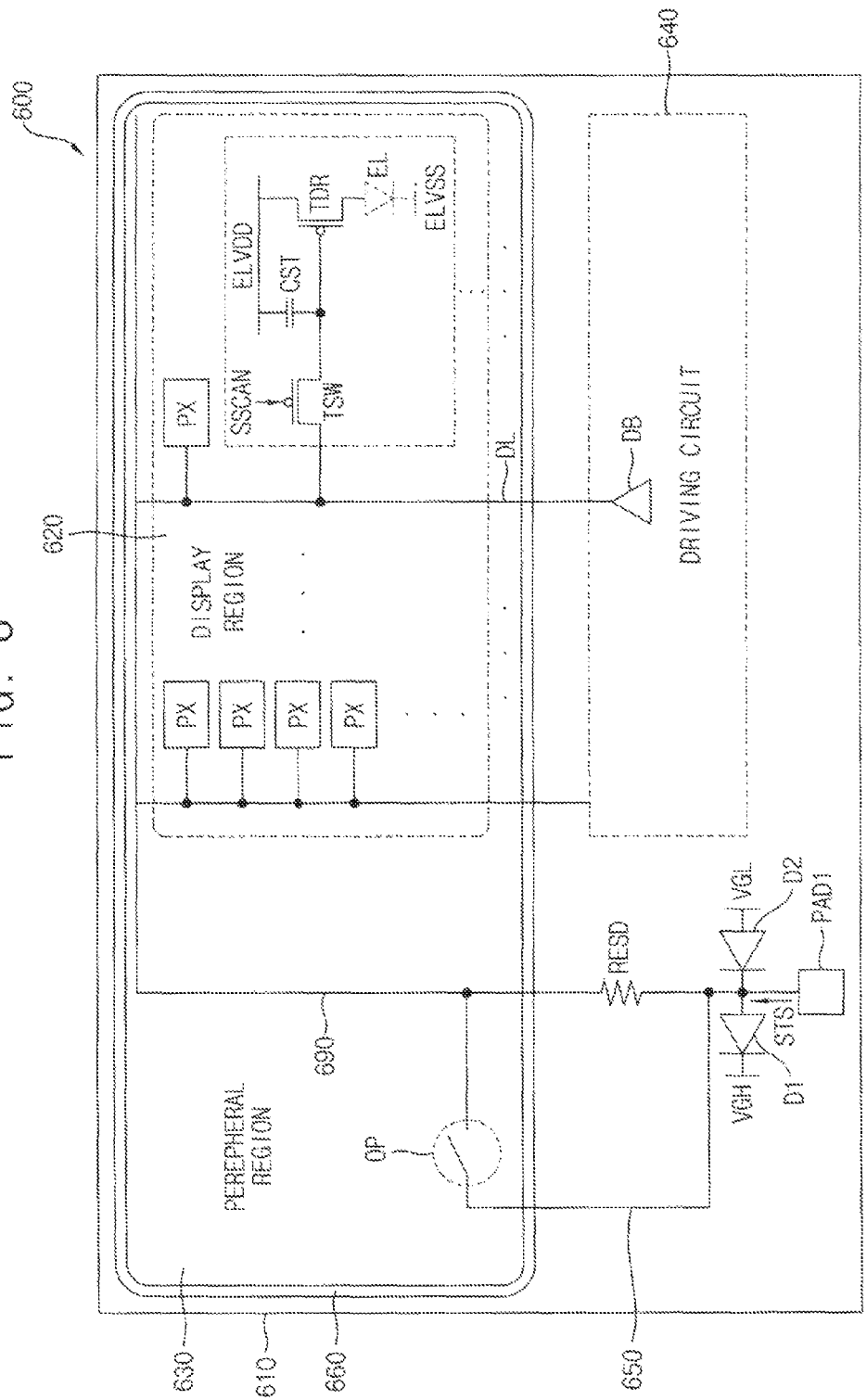
FIG. 8 is a diagram illustrating a display device according to example embodiments.

FIG. 8 is a diagram illustrating a display device according to example embodiments.

Referring to FIG. 8, a display device 600 includes a substrate 610 including a display region 620 and a peripheral region 630, at least one data line DL extending from the peripheral region 630 through the display region 620 on the substrate 610, a plurality of pixels PX connected to the at least one data line DL, an outer line 690 on the peripheral region 630, an electrostatic protection resistor RESD connected to the outer line 690, a pad PAD1 connected to the outer line 690 through the electrostatic protection resistor RESD, and a bypass line 650 for connecting the pad PAD1 to the outer line 690 by bypassing the electrostatic protection resistor RESD. In some example embodiments, the display device 600 may further include a driving circuit 640, a sealing member 660, and electrostatic discharge diodes D1 and D2 formed at a node between the electrostatic protection resistor RESD and the pad PAD1. In the display device 600 of FIG. 8, a ring repair line, a ring data line RDL and repair pixels RPX may not be formed. Further, in the display device 600 of FIG. 8, any line 690 on the peripheral region 630 may be used as the outer line 690 for applying a short circuit test signal STS.

In the display device 600 according to example embodiments, during a short circuit test process that detects a position of a short circuit defect, the short circuit test signal STS applied through the pad PAD1 may be supplied to a data line DL having the short circuit defect through the bypass line 650 and the outer line 690 by bypassing the electrostatic protection resistor RESD. Accordingly, the short circuit test signal STS having a sufficient current may be supplied to the data line DL having the short circuit defect, and thus the position of the short circuit defect may be readily detected by the thermal energy measurement.

Figure 9:
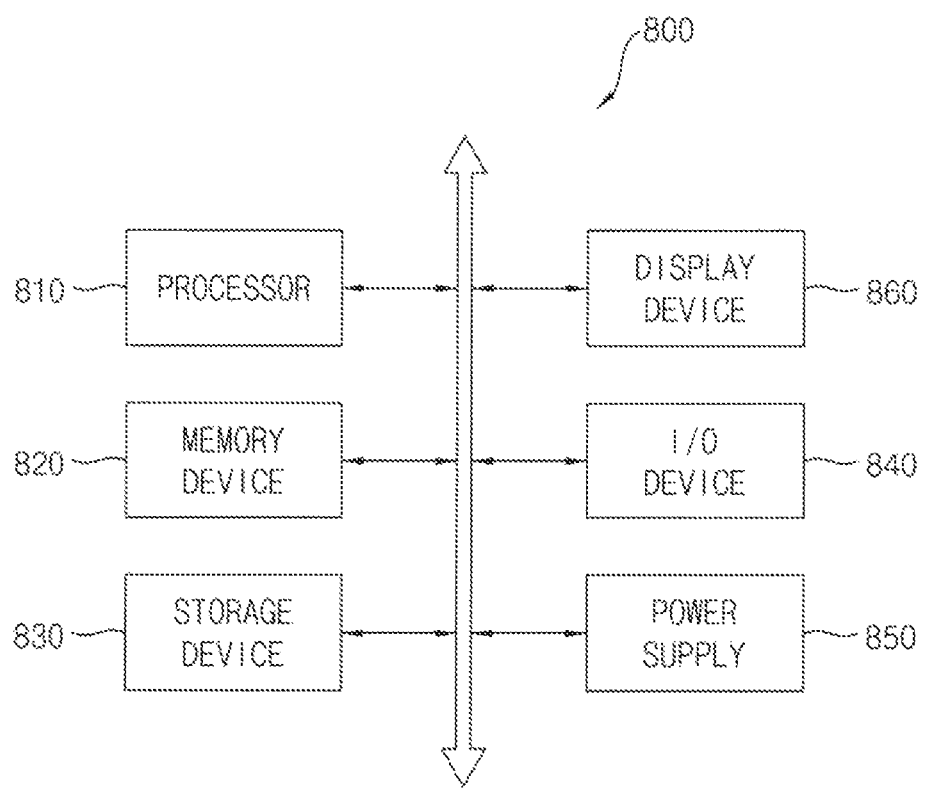
FIG. 9 is a block diagram illustrating an electronic device including a display device according to example embodiments.

FIG. 9 is a block diagram illustrating an electronic device including a display device according to example embodiments.

Referring to FIG. 9, an electronic device 800 may include a processor 810, a memory device 820, a storage device 830, an input/output (I/O) device 840, a power supply 850, and a display device 860. Here, the display device 860 may correspond to the display device 100 of FIG. 1, the display device 400 of FIG. 6, the display device 500 of FIG. 7 or the display device 600 of FIG. 8. In addition, the electronic device 800 may further include a plurality of ports for communicating with a video card, a sound card, a memory card, a universal serial bus (USB) device, other electronic devices, etc.

The processor 810 may perform various computing functions. The processor 810 may be a micro processor, a central processing unit (CPU), an application processor (AP), etc. The processor 810 may be coupled to other components via an address bus, a control bus, a data bus, etc. Further, the processor 810 may be coupled to an extended bus such as a peripheral component interconnection (PCI) bus.

The memory device 820 may store data for operations of the electronic device 800. For example, the memory device 820 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc.

The storage device 830 may be a solid state drive (SSD) device, a hard disk drive (HDD) device, a CD-ROM device, etc. The I/O device 840 may be an input device such as a keyboard, a keypad, a mouse device, a touchpad, a touch-screen, a remote controller, etc, and an output device such as a printer, a speaker, etc. The power supply 850 may provide power for operations of the electronic device 800.

The display device 860 may be an organic line emitting diode (OLED) display device, a liquid crystal display (LCD) device, or the like. In the display device 860 according to example embodiments, a short circuit test signal applied through a pad may be connected to a line having a short circuit defect through a bypass line and an outer line by bypassing an electrostatic protection resistor, and thus a position of the short circuit defect may be readily detected by thermal energy measurement.

According to example embodiments, the electronic device 800 may be any electronic device including the display device 860, such as a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
    a substrate including a display region where an image is displayed and a peripheral region adjacent to the display region;
    at least one line on the substrate, the at least one line extending from the peripheral region through the display region;
    a plurality of pixels on the display region, the pixels being connected to the at least one line;
    an outer line on the peripheral region, the outer line being connected to the at least one line during a short circuit test process that detects a position of a short circuit defect;
    an electrostatic protection resistor on the peripheral region, the electrostatic protection resistor being connected to the outer line;
    a pad on the peripheral region, the pad being connected to the outer line through the electrostatic protection resistor, a short circuit test signal being applied to the pad during the short circuit test process; and
    a bypass line connecting a node between the pad and the electrostatic protection resistor to the outer line during the short circuit test process such that the short circuit test signal bypasses the electrostatic protection resistor.

2. The display device of claim 1, wherein, during the short circuit test process, the short circuit test signal is applied to the at least one line through the bypass line and the outer line, and
    wherein thermal energy generated at the at least one line by the short circuit test signal is measured by a thermal detector to detect the position of the short circuit defect.

3. The display device of claim 2, wherein the at least one line is opened at the position of the short circuit defect, and a connecting line for connecting the opened line is formed using a laser chemical vapor deposition process.

4. The display device of claim 1, wherein the outer line is a ring repair line.

5. The display device of claim 4, wherein the at least one line is opened at the position of the short circuit defect into a first portion and a second portion,
    wherein the first portion of the at least one line is connected to a driving circuit, and directly receives an electrical signal from the driving circuit, and
    wherein the second portion of the at least one line is connected to the ring repair line, and receives the electrical signal through the ring repair line from the driving circuit.

6. The display device of claim 1, wherein the outer line is a repair data line.

7. The display device of claim 6, further comprising:
    at least one repair pixel on the peripheral region, the repair pixel being connected to the repair data line,
    wherein a light emitting element of at least one of the pixels located at the position of the short circuit defect is connected to the repair pixel instead of the at least one of the pixels.

8. The display device of claim 1, wherein the bypass line is opened after the short circuit test process.

9. The display device of claim 8, further comprising:
    a sealing member on the peripheral region, the sealing member surrounding the display region,
    wherein a position at which the bypass line is opened is covered by the sealing member.

10. The display device of claim 1, further comprising:
    a transistor between the electrostatic protection resistor and the outer line, the transistor configured to selectively connect the electrostatic protection resistor and the outer line in response to a test control signal.

11. The display device of claim 10, wherein the bypass line connects the pad to the outer line such that the short circuit test signal bypasses the electrostatic protection resistor and the transistor.

12. The display device of claim 1, further comprising:
    a first diode including an anode terminal connected to a node between the electrostatic protection resistor and the pad and a cathode terminal connected to a high voltage; and
    a second diode including a cathode terminal connected to the node between the electrostatic protection resistor and the pad and an anode terminal connected to a low voltage.

13. The display device of claim 1, wherein the at least one line is a data line.

* * * * *